(12) United States Patent
Bisig

(10) Patent No.: US 9,014,297 B2
(45) Date of Patent: Apr. 21, 2015

(54) DATA AND/OR COMMAND SIGNAL TRANSMISSION DEVICE WITH ANTENNA ARRANGEMENTS

(71) Applicant: Swiss Timing Ltd., Corgémont (CH)

(72) Inventor: Martin Bisig, Zuchwil (CH)

(73) Assignee: Swiss Timing Ltd, Corgémont (CH)

( * ) Notice: Subject to any disclaimer, the term of this patent is extended or adjusted under 35 U.S.C. 154(b) by 0 days.

(21) Appl. No.: 14/018,888

(22) Filed: Sep. 5, 2013

(65) Prior Publication Data

US 2014/0064409 A1 Mar. 6, 2014

(30) Foreign Application Priority Data

Sep. 5, 2012 (EP) .................................... 12183182

(51) Int. Cl.
*H04L 27/00* (2006.01)
*H04B 7/04* (2006.01)
*H03C 1/04* (2006.01)

(52) U.S. Cl.
CPC ................ *H04B 7/0404* (2013.01); *H03C 1/04* (2013.01)

(58) Field of Classification Search
CPC ....... H04B 7/00; H04B 7/0404; H04L 27/362
USPC ............................ 375/295, 299, 300; 343/751
See application file for complete search history.

(56) References Cited

U.S. PATENT DOCUMENTS

| | | | |
|---|---|---|---|
| 8,514,965 B2 * | 8/2013 | Christensen et al. ......... | 375/285 |
| 2002/0034191 A1 | 3/2002 | Shattil | |
| 2009/0146893 A1 * | 6/2009 | Mayes et al. .................. | 343/751 |

FOREIGN PATENT DOCUMENTS

WO    WO 2005/029801 A1    3/2005

OTHER PUBLICATIONS

European Search Report Issued on Apr. 22, 2013 in Europe 12183182, filed Sep. 5, 2012 ( with English Translation).
R.C. Hansen "Electrically Small, Superdirective, and Superconducting Antennas", A John Wiley & Sons, Inc., Publication, 2006, 179 pages.
James S. McLean, "A Re-Examination of the Fundamental Limits on the Radiation Q of Electrically Small Antennas", IEEE Transactions on Antennas and Propagation, vol. 44, No. 5, May 1996, pp. 672-676.

\* cited by examiner

*Primary Examiner* — Shuwang Liu
*Assistant Examiner* — David S Huang
(74) *Attorney, Agent, or Firm* — Oblon, McClelland, Maier & Neustadt, L.L.P.

(57) ABSTRACT

The data and/or command signal transmission device includes a first signal generator connected to a first antenna arrangement, a second signal generator connected to a second antenna arrangement, a third signal generator connected to a third antenna arrangement, and a synchronization circuit. The synchronization circuit performs data amplitude modulation by combining the signals transmitted by the antenna arrangements. The signals transmitted by the first and third antenna arrangements are in-phase in a first stable modulation state and 180° out of phase in a second stable modulation state. In a modulation state transition phase, the first and third signals delivered by the first and third generators are at a different frequency from the carrier frequency of the signals delivered by the second generator. The resonance frequency of the first and third antenna arrangements is also adapted in the transition phase.

18 Claims, 6 Drawing Sheets

DATA AND/OR COMMAND SIGNAL TRANSMISSION DEVICE WITH ANTENNA ARRANGEMENTS

This application claims priority from European Patent Application No. 12183182.0 filed Sep. 5, 2012, the entire disclosure of which is incorporated herein by reference.

FIELD OF THE INVENTION

The invention concerns a device for transmitting data and/or command signals, which uses a set of antennas, in particular of small dimensions, for the combined transmission of said signals. This transmission device is mainly used for transmitting long or medium wave signals, such as, for example, for transponder systems.

BACKGROUND OF THE INVENTION

For data or command signal transmission, transmission antennas must be capable of irradiating or radiating one or more electrical signals with minimum losses and with a properly matched bandwidth. Thus, all the spectral components of the electrical signals are radiated in the best possible manner.

For small electrical antennas, namely antennas which have a much smaller physical size than the transmission signal wavelength, it is necessary to define a compromise between power loss and the bandwidth of the signals to be transmitted. As a general rule, for small antennas with a reasonable bandwidth, the product between power loss and signal bandwidth must be constant. This property may also be explained by the quality factor expression Q.

Some progress has already been made towards producing antennas beyond this operating limit, but without attaining the hoped-for operation. Thus, transmission antennas do not exist which are capable of radiating electrical signals with a good quality factor Q taking into account the Chu limit. The Chu limit for conventional antennas describes the minimum quality factor, and consequently the maximum bandwidth, according to the size of the conventional antenna. The Chu limit, well known for developing said antennas, is based on the hypothesis that said antenna is passive, linear and small.

To precisely determine this quality factor Q, reference may be made to the article entitled "A re-examination of the fundamental limits on the radiation Q of electrically small antennas" by J. S. McLean in the journal IEEE transaction on antennas and propagation, 1996, vol. 44, issue 5. Some small antenna embodiments are also described in the article entitled "Electrically small super-directive and super-conductive antennas" by R. C. Hansen in the 2006 work by Wiley, pages 62 to 84.

SUMMARY OF THE INVENTION

It is therefore an object of the invention to overcome the drawbacks of the aforementioned state of the art by proposing a data and/or command signal transmission device with small, high quality antennas, having a bandwidth beyond the Chu limit and capable of transmitting electromagnetic signals with a relatively low power loss.

The invention therefore concerns a data and/or command signal transmission device, the device including:
- a first signal generator connected to a first antenna arrangement,
- a second signal generator connected to a second antenna arrangement,
- an oscillator for delivering an oscillating signal, in order to clock the signal generators to control each antenna arrangement, and
- a synchronisation circuit connected at least to the first signal generator and to the first and second antenna arrangements the synchronisation circuit being arranged to receive at input a data and/or command modulation signal and to control, in a synchronous manner, the first signal generator and the first and second antenna arrangements to perform amplitude modulation on the data and/or command to be transmitted on at least two amplitude levels by a combination of the signals transmitted by the antenna arrangements, a first stable modulation state on a first amplitude level being defined when the signals transmitted at a defined carrier frequency f0 by the first and second antenna arrangements are in-phase, and a second stable modulation state on a second amplitude level being defined when the signals transmitted at a defined carrier frequency f0 by the first antenna arrangement are 180° out of phase from the signals transmitted at a defined carrier frequency f0 by the second antenna arrangement, wherein the synchronisation circuit is arranged to temporarily and dynamically switch the first signal generator for the delivery of signals to the first antenna arrangement at a frequency f1 higher or lower than the carrier frequency f0 in a transition phase from a first modulation state to a second modulation state or vice versa in a synchronous manner on the basis of n signal cycles at the carrier frequency f0 transmitted by the second antenna arrangement and counted in the synchronisation circuit, and wherein the synchronisation circuit is arranged to adapt, in an inductive or capacitive manner, the resonance frequency of the first antenna arrangement to frequency f1 of the signals delivered by the first signal generator during the modulation state transition phase relative to the resonance frequency determined at the carrier frequency f0 of the first and second antenna arrangements in a stable modulation state.

Specific embodiments of the data and/or command signal transmission device are defined in the dependent claims 2 to 15.

One advantage of the data and/or command signal transmission device lies in the fact that frequency switching for amplitude modulation of the signals transmitted by the antenna arrangements is performed synchronously with dynamic frequency adaptation of the resonance frequency of the antenna arrangements.

Advantageously, the resonance frequency of at least one antenna arrangement may be adapted by adding or removing a complementary capacitor in parallel with a capacitor series-connected to an inductance and a loss resistor. Synchronous frequency switching for data modulation is thus performed at a zero voltage crossing across each capacitor. This allows the use of loop antennas with a high quality factor Q and avoids any transitory response during modulation state transition.

Advantageously, the transmission device of the present invention produces cosine transition of symbols or of modulation states in the modulated signals. This has an advantageous effect on the spectral efficiency of the transmitted signals.

The invention therefore also concerns a method of actuating the data and/or command signal transmission device, said method including the steps consisting in:
- delivering a data and/or command modulation signal to the synchronisation circuit,
- synchronously controlling via the synchronisation circuit at least the first signal generator, and the first and second antenna arrangements to perform amplitude modulation on the data and/or command to be transmitted on at least two amplitude levels by combining the signals transmitted by the antenna arrangements, a first stable modulation state on a first amplitude level being defined when the signals transmitted at a defined carrier frequency f0 by the first and second antenna arrangements are in-phase, and a second stable modulation state on a second amplitude level being defined when the signals transmitted at a defined carrier frequency f0 by the first antenna arrangement are 180° out of phase from the signals transmitted at a defined carrier frequency f0 by the second antenna arrangement, temporarily and dynamically switching the first signal generator via the synchronisation circuit for the delivery to the first antenna arrangement of signals at a first frequency f1 lower or higher than the carrier frequency f0 in a modulation state transition phase and synchronously on the basis of n cycles of signals at carrier frequency f0 transmitted by the second antenna arrangement and counted in the synchronisation circuit, and adapting, in an inductive or capacitive manner, the resonance frequency of the first antenna arrangement to frequency f1 during the modulation state transition phase.

The invention therefore also concerns a method of actuating the data and/or command signal transmission device, said method including the steps consisting in:

delivering a data and/or command modulation signal to the synchronisation circuit, synchronously controlling via the synchronisation circuit at least the first signal generator and the third signal generator, and the first, second and third antenna arrangements to perform amplitude modulation on the data and/or command to be transmitted on at least two amplitude levels by combining the signals transmitted by the antenna arrangements, a first stable modulation state on a first amplitude level being defined when the signals transmitted at a defined carrier frequency f0 by the first, second and/or third antenna arrangements are in-phase, and a second stable modulation state on a second amplitude level being defined when the signals transmitted at a defined carrier frequency f0 by the first and third antenna arrangements are 180° out of phase from the signals transmitted at a defined carrier frequency f0 by the second antenna arrangement, temporarily and dynamically switching the first and third signal generators via the synchronisation circuit for the delivery to the first antenna arrangement of signals at a first frequency f1 lower or higher than the carrier frequency f0, and for the delivery to the third antenna arrangement of signals at a third frequency f3 higher or lower than carrier frequency f0 and inversely to the first frequency f1 in a modulation state transition phase and synchronously on the basis of n cycles of signals at carrier frequency to transmitted by the second antenna arrangement and counted in the synchronisation circuit, and adapting, in an inductive or capacitive manner, the resonance frequency of the first antenna arrangement to frequency f1 and the resonance frequency of the third antenna arrangement to frequency f3 during the modulation state transition phase.

BRIEF DESCRIPTION OF THE DRAWINGS

The objects, advantages and features of the data and/or command signal transmission device according to the invention, and the method of activating the same will appear more clearly in the following description of non-limiting embodiments illustrated by the drawings, in which.

DETAILED DESCRIPTION OF THE INVENTION

In the following description, all those elements of the data and/or command signal transmission device that are well known to those skilled in the art in this technical field will be described only in a simplified manner.

Figure 1:
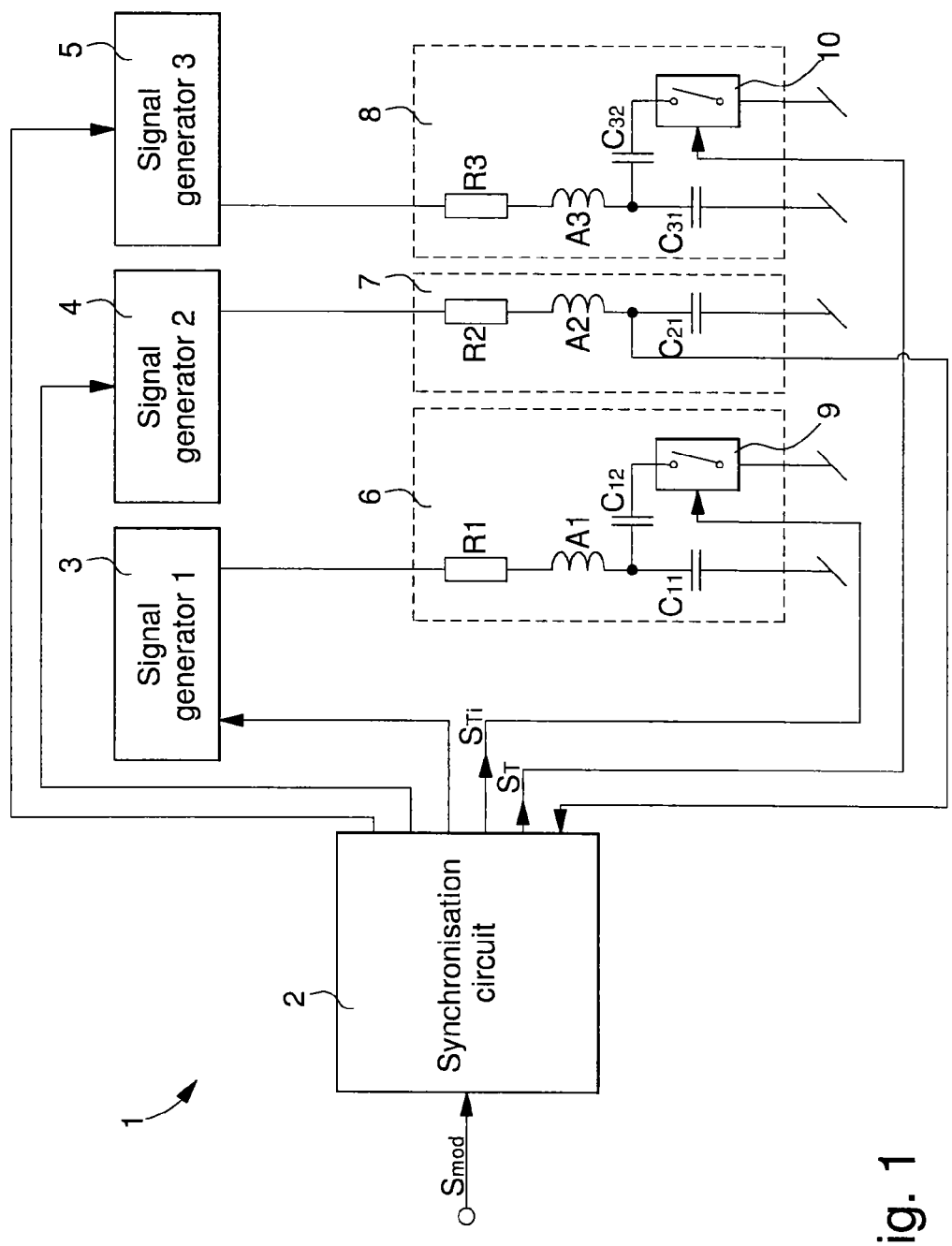
FIG. 1 is a general view of the various components of a data and/or command signal transmission device according to the invention.

FIG. 1 shows a simplified view of data and/or command signal transmission device 1. This transmission device 1 can be used for transmitting data and/or command signals to a set of transponders for a sports competition, for example, or to radio stations. Each transponder provided with a side antenna may be carried, in particular by a competitor, in order to receive data from transmission device 1 of the present invention. Preferably, the carrier frequency of the data and/or command signals transmitted by transmission device 1 may be within the low frequency range. The carrier frequency may be around 128 kHz. The transmitted data rate in the signals may be around 16.5 kbit/s. The signals are transmitted with a bandwidth of around 4 kHz, which is suitable for a transponder system.

Transmission device 1 transmits data and/or command amplitude modulation signals. The amplitude modulation may be ON-OFF keying or at two amplitude levels for amplitude shift keying. To achieve this, the data and/or command amplitude modulation may be performed immediately via two or three antennas A1, A2, A3 of the transmission device by combining or adding signals transmitted by each antenna. The antennas are controlled independently of each other. Overlaying the transmitted signals may be destructive depending on the signal phase difference, which depends on the data and/or command state to be transmitted. This means that amplitude modulation of the data and/or command to be transmitted is obtained by combining or adding the transmitted in-phase or out-of-phase signals. Any transmission power loss is also reduced by using the set of antennas, which, in addition to radiating the electromagnetic signals, act as a modulator assembly for the data and/or command to be transmitted.

Generally, transmission device 1 includes a synchronisation circuit 2, a first signal generator 3 for controlling a first antenna arrangement 6, a second signal generator 4 for controlling a second antenna arrangement 7, and a third signal generator 5 for controlling a third antenna arrangement 8. An oscillator (not shown) is also provided for synchronously clocking the three signal generators 3, 4, 5. The oscillator may form part of synchronisation circuit 2, which in this case controls the three signal generators, but preferably the oscillator is comprised in second signal generator 4. If the oscillator is comprised in the second signal generator, a synchronous clocking signal is delivered from second signal generator 4 to first signal generator 3 and to third signal generator 5.

With no data and/or command amplitude modulation or in a stable modulation state, all of the sinusoidal signals transmitted by antenna arrangements 6, 7 and 8 are at the same carrier frequency f0. To perform the data and/or command amplitude modulation, the frequency of the signals delivered by the first and third generators 3, 5, is temporarily modified relative to the carrier frequency of the signals of second signal generator 4 during each modulation state transition. The frequency change in the signals delivered by the first and third signal generators 3, 5 occurs temporarily during the transition phase from a first state to a second data and/or command modulation state. A first state may define a "1" state, while a second state may define a "0" state or vice versa.

During each modulation state transition phase, the signals delivered to the first antenna arrangement 6 by first signal generator 3 are temporarily at a frequency equal to f1=f0−Δf for a certain number of signal cycles of the signals of second signal generator 4, which remain at a carrier frequency equal to f0. The signals delivered to the third antenna arrangement 8 by third signal generator 5 are also temporarily at a frequency equal to f3=f0+Δf for a certain number of cycles of the signals of second signal generator 4. After this certain number of cycles, the frequency of the signals delivered by the three generators is re-set to the same carrier frequency f0.

Figure 3:
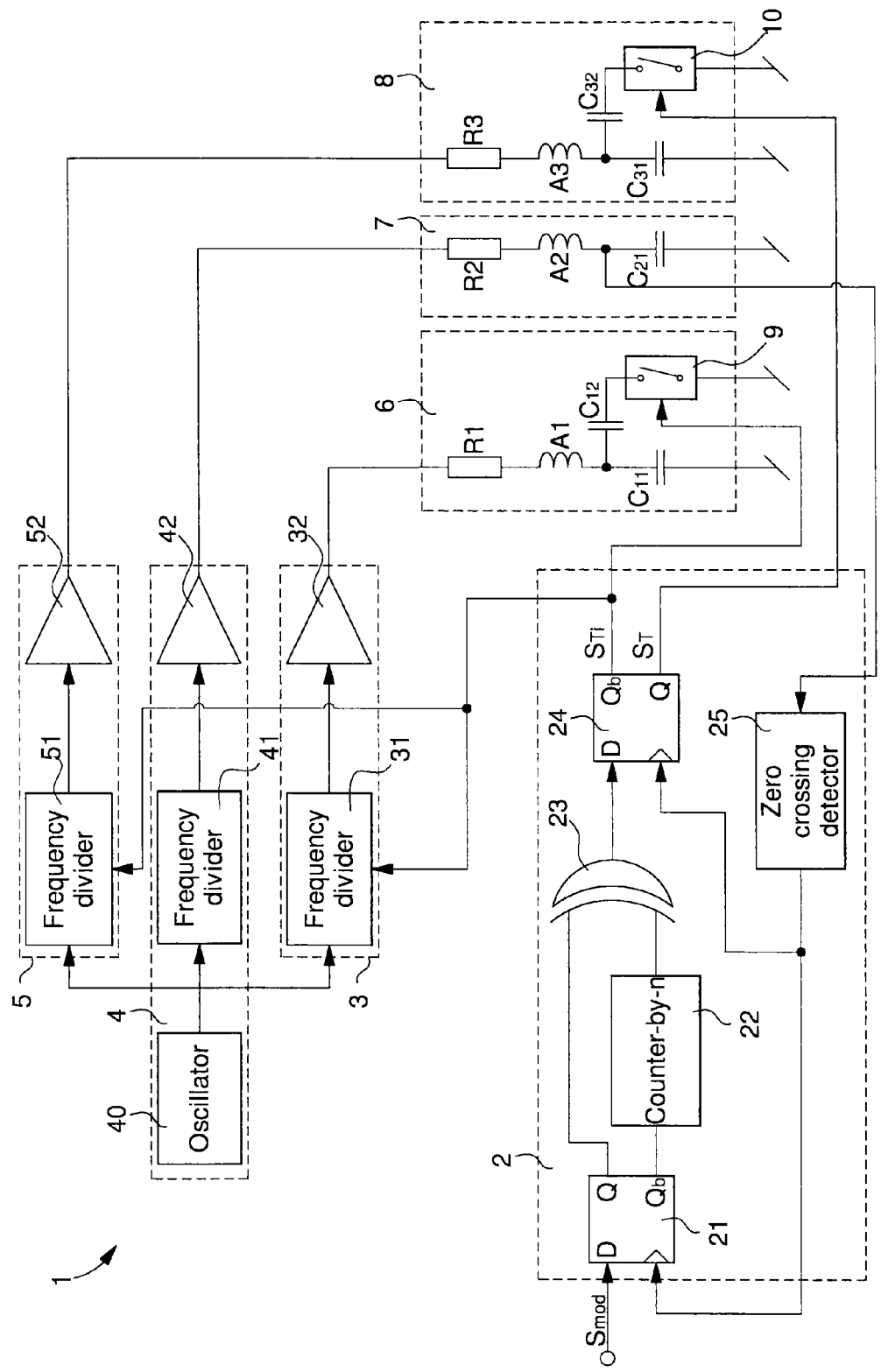
FIG. 3 shows a first embodiment of the data and/or command signal transmission device according to the invention.
Figure 4:
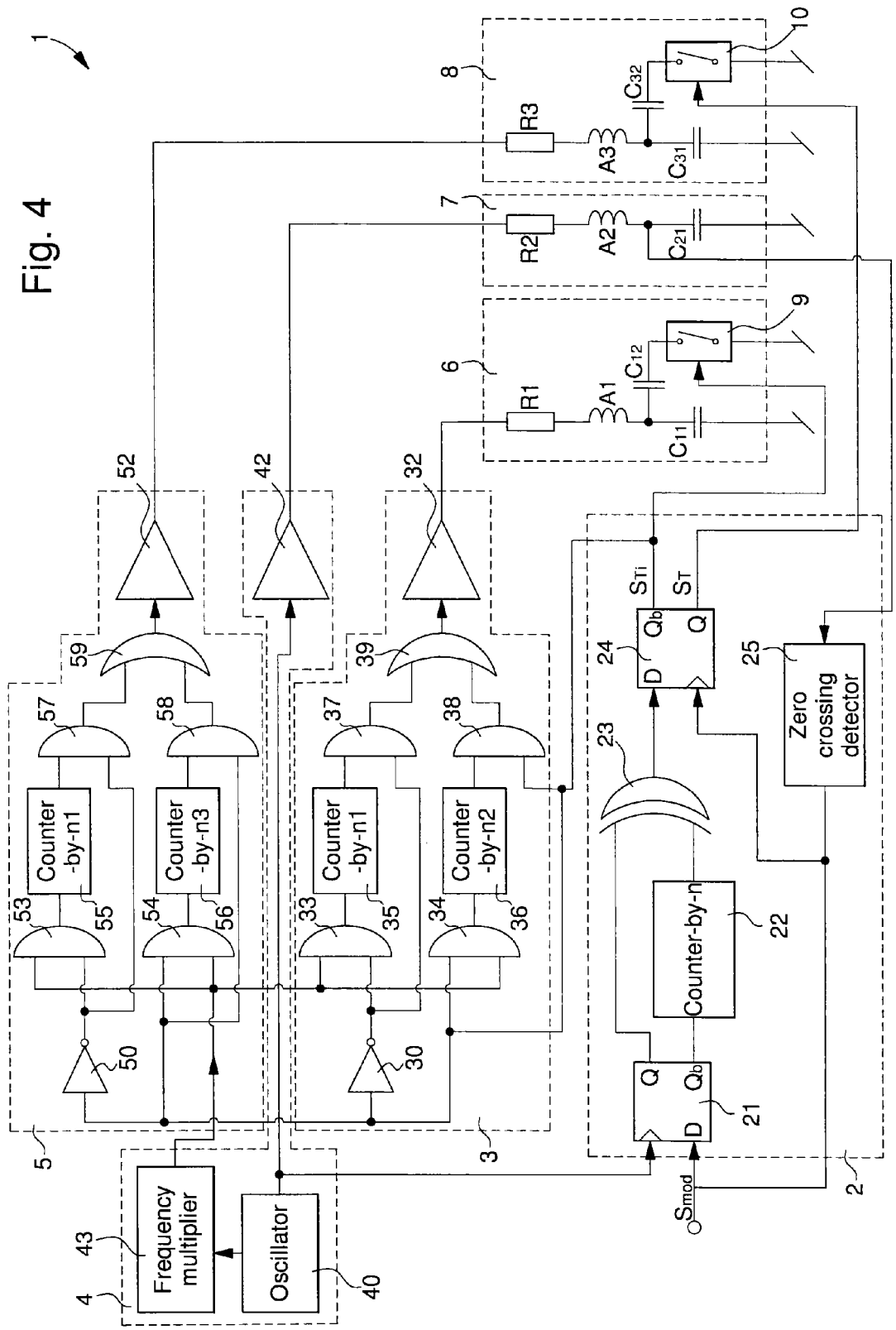
FIG. 4 shows a second embodiment of the data and/or command signal transmission device according to the invention.

Synchronisation circuit 2, explained in more detail below with reference to FIGS. 3 and 4, is arranged to control the synchronous switching of signals delivered by the signal generators. To achieve this, frequency f1 must be equal to f0·(n−0.5)/n, while frequency f3 must be equal to f0·(n+0.5)/n, where n is an integer number defining the number of cycles at frequency f0 for each modulation state transition phase. For a carrier frequency f0 selected at 128 kHz, the number n must be equal to 8, which gives a first frequency f1 equal to 120 kHz and a third frequency f3 equal to 136 kHz. The ratio f0/Δf may also be defined as equal to N, which is an even integer number, where it is necessary to count N/2 cycles at frequency f0 of the signals delivered by second signal generator 7 for each modulation state transition phase.

To generate a second modulation state "0", the signals transmitted by the first and third antenna arrangements 6 and 8 must, in principle, have a phase difference of 180° relative to the signals transmitted by the second antenna arrangement 7. Conversely, to generate a first modulation state "1", all the signals transmitted by antenna arrangements 6, 7 and 8 are in-phase. Preferably, the amplitude of the signals transmitted by first antenna arrangement 6 and third antenna arrangement 8 may be adapted to half the amplitude of the signals transmitted by the second antenna arrangement 7. Thus, with a 180° phase difference of the signals transmitted by the first and third antenna arrangements 6 and 8 relative to the signals transmitted by the second antenna arrangement 7, the combination or addition of the three transmitted signals becomes zero after the transition phase from a first state "1" to second state "0".

Figure 2:
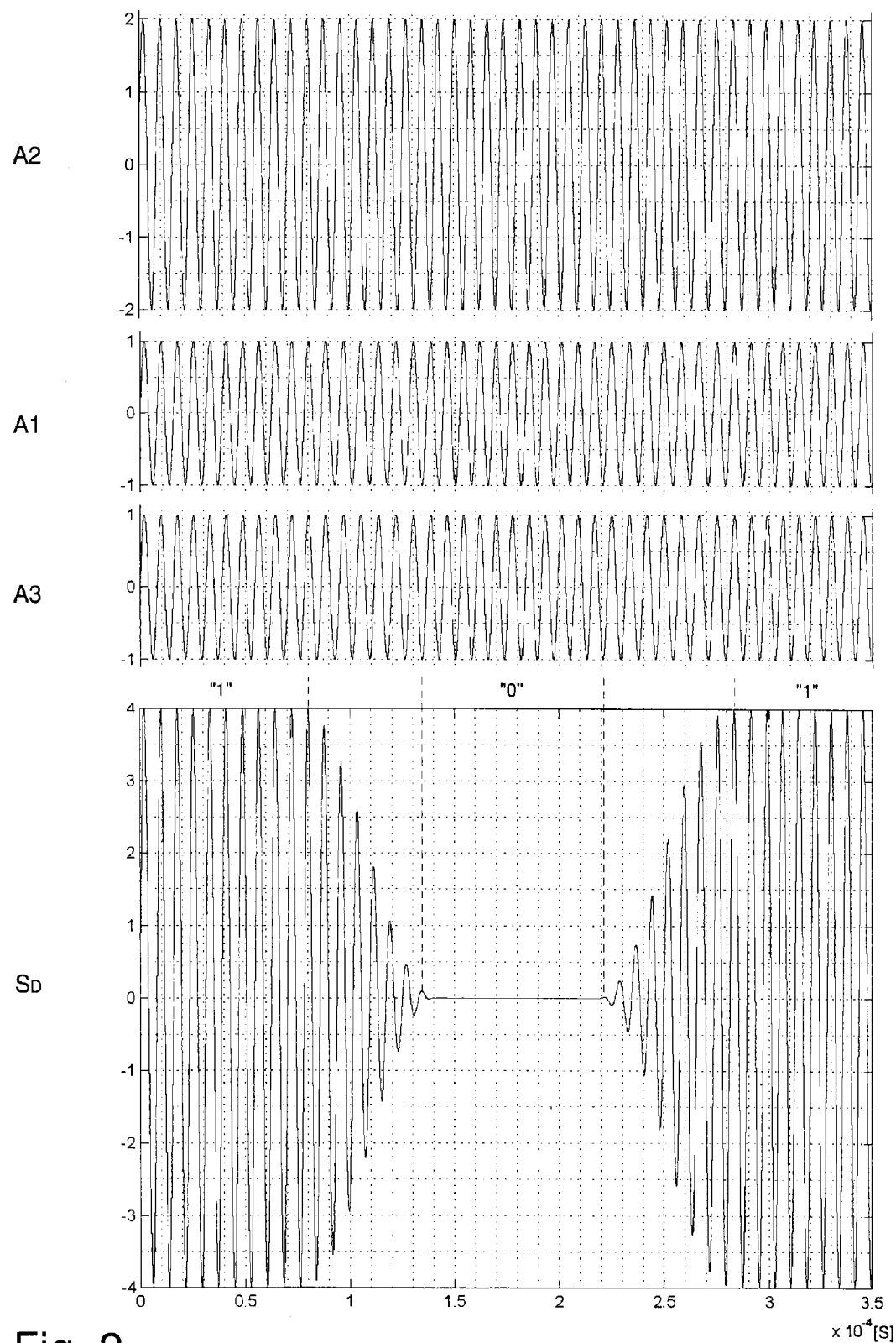
FIG. 2 shows a temporal diagram of signals transmitted by the antennas for data and/or command amplitude modulation of the data and/or command signal transmission device according to the invention.

FIG. 2 shows the signals transmitted by antennas A1, A2, A3 of the three antenna arrangements 6, 7, 8, which are normally sinusoidal signals, and the combined signals $S_D$, in which data amplitude modulation is carried out. It may be noted in FIG. 2 that the amplitude of the combined data signals $S_D$ is maximum when the three signals transmitted by the antennas are in-phase, whereas the amplitude becomes zero when the signals transmitted by antenna 1 and antenna 3 are out-of-phase by 180° from the signals transmitted by antenna 2. It is therefore possible to define a first modulation state "1" and a second modulation state "0" by combining the three signals transmitted by the transmission device antennas. Each modulation state transition phase may also be noted, particularly for the change from a "1" state to a "0" state, and for the change from a "0" state to a "1" state after 8 signal cycles of the second antenna are counted.

Of course, it is also possible to envisage using only two antennas A1 and A2 to perform data amplitude modulation. In these conditions, only two signal generators, respectively connected to two antenna arrangements, are required. Preferably, the signal amplitude of each antenna may be identical, which produces a "1" state, when the two signals transmitted by the two antennas are in-phase and a "0" state when the two signals transmitted by the two antennas are out-of-phase by 180°.

It should also be noted that the amplitude of the first and third signals of antennas A1 and A3 may be different from half the amplitude of the signals of antenna A2. However, the amplitude resulting from the addition of the first and third signals of antennas A1 and A3 must still be equal to or less than the amplitude of the antenna A2 signals, even if the amplitude of the antenna A1 signals is also different from the amplitude of the antenna A3 signals.

In principle, detection of the combined data amplitude modulation signals $S_D$, as shown, is properly picked up by a receiver device, such as a transponder, at a distance of at least 2, 10 or 15 m. The loop antennas A1, A2, A3 used for transmission device 1 of FIG. 1 must be arranged to be oriented in the same direction with their axes parallel to each other. The dimension of each antenna in the plane may be identical and 60 cm by 60 cm or with a diameter of around 60 cm.

Each loop antenna, not shown, may comprise 14 turns of an insulated wire winding to obtain an inductance of around 370 μH. A space of 1 mm may be set between each insulated wire. The maximum current through each antenna may be around at least 1.2 A, or up to 2.5 A with a field force generated at 10 m of around 66 dBμA/m. Transmission device 1 may be powered by a 5 V voltage source.

These antennas may be partly overlaid so that the inductive coupling between antennas A1 and A2 and the inductive coupling between antennas A2 and A3 is minimal. The antennas may also be arranged next to each other in the same plane or also be arranged one on top of the other. However, the dimension of the area occupied by the three antennas A1, A2 and A3 must generally be much smaller than the wavelength of the signals transmitted by each antenna. For a carrier frequency f0 at 125 kHz for example, the wavelength is around 2400 m. For close field transmission applications, the area occupied by the three antennas A1, A2 and A3 must be much smaller than the transmission distance or the magnetic/electrical field measuring distance, which is set by national and international standards.

In each stable modulation state, the resonance frequency of each antenna arrangement 6, 7 and 8 is well defined as a function of the signals delivered by each signal generator 3, 4 and 5 at a carrier frequency f0. However, since the signal frequency is temporarily modified for the first and third antenna arrangements 6 and 8, the resonance frequency must also be dynamically adapted during the modulation state transition phase for each of these antenna arrangements 6 and 8. By dynamically and synchronously adapting the resonance frequency of the first and third antenna arrangements 6 and 8 relative to the phase of the signals at carrier frequency f0, it is possible to make each antenna arrangement with a high quality factor Q. This high quality factor Q may be higher than 100 to simultaneously keep a bandwidth much higher than 10%. This reduces power losses particularly during each modulation state transition phase and means there is no transitory response, if the antenna switching is performed synchronously at a well defined moment.

In each antenna arrangement 6, 7 and 8, there may be inductive or capacitive elements which can be combined to adapt the antenna resonance frequency as a function of the frequency of the signals delivered by each signal generator 3, 4 and 5. In principle, only the first antenna arrangement 6 and the third antenna arrangement 8 include these complementary inductive or capacitive elements for adapting the resonance frequency during each modulation state transition phase.

The first antenna arrangement 6 may include, in series between the output of the first signal generator 3 and an earth terminal, a loss resistor R1, an inductance A1 defining the first antenna and at least a first capacitor $C_{11}$. A second capacitor $C_{12}$ may be placed in parallel with first capacitor $C_{11}$ of the first antenna arrangement via a first switch 9 to adapt the resonance frequency. This first switch is controlled synchronously by a first command signal $S_{Ti}$ of synchronisation circuit 2. This first switch may be conventionally formed of a MOS transistor, such as an NMOS transistor, whose source and drain terminals are connected between a terminal of the second capacitor $C_{12}$ and the earth terminal. The gate terminal of this NMOS transistor is arranged to receive the first command signal $S_{Ti}$. If this first command signal $S_{Ti}$ is at the high state, the NMOS transistor is made conductive and second capacitor $C_{12}$ is placed in parallel to first capacitor $C_{11}$. However, if this first command signal $S_{Ti}$ is at the low state, for example at 0 V, the NMOS transistor is non-conductive and only the first capacitor $C_{11}$ is series-connected to inductance A1 and loss resistor R1.

The second antenna arrangement 7 may simply include, in series between the output of the second signal generator 4 and an earth terminal, a loss resistor R2, an inductance A2 defining the second antenna and at least one capacitor $C_{21}$. It is not necessary for this second antenna arrangement 7 to adapt the resonance frequency during the modulation state transition phase. The elements which form this second antenna arrangement 7 are initially determined so that the resonance frequency matches the carrier frequency f0 of the signals delivered by second signal generator 4.

The third antenna arrangement 8 may include, in series between the output of the third signal generator 5 and an earth terminal, a loss resistor R3, an inductance A3 defining the third antenna and at least a first capacitor $C_{31}$. A second capacitor $C_{32}$ may be placed in parallel to the first capacitor $C_{31}$ of the third antenna arrangement via a second switch 10 to adapt the resonance frequency. This second switch is controlled synchronously by a second command signal $S_T$, which is the inverse of the first command signal $S_{Ti}$. The second command signal is delivered by synchronisation circuit 2. This second switch 10 may, like first switch 9, be formed of a MOS transistor, such as an NMOS transistor, whose source and drain terminals are connected between a terminal of second capacitor $C_{32}$ of third antenna arrangement 8 and the earth terminal. The gate terminal of this NMOS transistor is arranged to receive the second command signal $S_T$. If this second command signal $S_T$ is at the high state, the NMOS transistor is made conductive and second capacitor $C_{32}$ is placed in parallel to first capacitor $C_{31}$. However, if this second command signal $S_T$ is at the low state, for example at 0 V, the NMOS transistor is non-conductive and only the first capacitor $C_{31}$ is series-connected to inductance A3 and loss resistor R3.

By way of numerical example, loss resistors R1, R2 and R3 may each be set at a resistive value equal to 3 Ohms. Each inductance A1, A2 and A3 may have a value of 370 pH. The first capacitor $C_{11}$ of first antenna arrangement 6 may have a capacitive value equal to 4.183 nF, just like capacitor $C_{21}$ of second antenna arrangement 7. The second capacitor $C_{12}$ of first antenna arrangement 6 may have a capacitive value equal to 576 pF. The first capacitor $C_{31}$ of third antenna arrangement 8 may have a capacitive value equal to 3.705 nF, and second capacitor $C_{32}$ of third antenna arrangement 8 may have a capacitive value equal to 478 pF. These numerical values are defined for transmission device 1 to operate with signals transmitted at a carrier frequency f0 equal to 128 kHz, and for temporarily modified frequencies of the first and third antenna arrangements 6 and 8 equal to 120 kHz and 136 kHz. For the modified frequencies, the first switch 9 is temporarily closed to have a capacitive value of 4.759 nF with first capacitor $C_{11}$ placed in parallel to second capacitor $C_{12}$, whereas the second switch 10 is open with a capacitive value of 3.705 nF of first capacitor $C_{31}$.

When each modulation state is properly set after each modulation state transition phase, the signals transmitted by the three antennas A1, A2 and A3 are at a carrier frequency f0, which may be equal to 128 kHz. In each stable modulation state, the first switch 9 is still opened by the first command signal $S_{Ti}$ delivered by synchronisation circuit 2, whereas the second switch 10 is still closed, as it is controlled by the second command signal $S_T$. However, during the modulation state transition phase, the first switch 9 is temporarily closed, whereas the second switch 10 is temporarily open. To be able to switch the frequencies of the signals delivered by the first and third signal generators 3 and 5, the switching must be performed synchronously and at the right moment with respect to the phase of the signals at carrier frequency f0, to avoid any transitory response.

The modulation state transition phase may last for 8 sinusoidal signal cycles of second antenna arrangement 7. By adapting the resonance frequency of the first and third antenna arrangements 6 and 8, each frequency switch of the signals delivered by the first and third signal generators 3 and 5 must be performed synchronously by detecting the zero crossings of the sinusoidal signals of the second antenna arrangement. To achieve this, the connection node between inductance A2 and capacitor $C_{21}$ of second antenna arrangement 7 is connected to synchronisation circuit 2, which includes a zero voltage crossing detector. The resonance frequency must be adapted at the moment when the voltage across capacitor $C_{21}$ of second antenna arrangement 7 is at 0 V, with no stored electrical energy to prevent any transitory response. At the same moment, the voltage at the start and at the end of each transition phase across each of capacitors $C_{11}$ and $C_{31}$ must necessarily be at 0 V.

Each zero crossing detected by the detector may be counted by a counter in the synchronisation circuit to control the closing or opening of the first and second switches 9 and 10. Likewise, the first command signal $S_{Ti}$ may be used to control the frequency switch of the first and third signal generators 3 and 5. The frequency switch of antenna arrangements 6 and 8 also occurs at the zero crossing of the signals transmitted by first antenna A1 and third antenna A3. However, the frequency switch occurs once with a 180° phase difference relative to the signals of second antenna arrangement 7 for the second modulation state, and in-phase for the first modulation state. Thus, each modulation state transition is performed synchronously with dynamic modification of each resonance frequency of the antenna arrangements. This allows a continuous and muted transition to be performed with no power loss by a crossing of the disengaged cosine or raised cosine type from one modulation state to another. However, with two antennas, the modulation state transition on the OOK modulation signals cannot be cosine shaped, but with a change, which introduces a "fold" in the transmitted modulation signals. This results in very poor behaviour in terms of spectral efficiency.

FIG. 3 shows a first slightly more detailed embodiment of transmission device 1. It should be noted that elements in FIG. 3 that are the same as those in FIG. 1 bear identical reference signs. Consequently, for the sake of simplification, the description of all these elements will not be repeated. The resonance frequency of the first and third antenna arrangements 6 and 8 is adapted in a capacitive manner as in the general embodiment shown in FIG. 1. To achieve this, a second complementary capacitor $C_{12}$, $C_{32}$ can be placed in parallel to a first capacitor $C_{11}$, $C_{31}$ via a first switch 9 or a second switch 10, controlled inversely.

The second signal generator 4 preferably includes an oscillator 40 capable of generating an oscillating signal at a frequency which may be chosen to be higher than the MHz, for example at 32.64 MHz. The oscillating signal may be sinusoidal, but is preferably formed of rectangular pulses. The oscillating signal frequency is divided in a frequency divider 41, which thus delivers a divided frequency signal to a drive circuit 42. On basis of the divided frequency signal, drive circuit 42 delivers determined frequency signals to second antenna arrangement 7. The determined frequency may be a carrier frequency f0 equal for example to 128 kHz. In these conditions, frequency divider 41 has to divide the oscillating signal by a factor equal to 255.

It should be noted that it is also the task of drive circuit 42 to adapt the amplitude of the signals transmitted by antenna A2 of second antenna arrangement 7. To achieve this, drive circuit 42 may be controlled by a processing unit with a microprocessor (not shown). Drive circuit 42 may be formed of a non-linear amplifier or may also include a well known pulse width modulator. This pulse width modulator is controlled by the microprocessor processing unit based on a voltage or current measurement taken at the output of drive circuit 42, until the desired amplitude is obtained for the signals transmitted by antenna A2.

The first signal generator 3 is formed of a programmable frequency divider 31 followed by a drive circuit 32, which delivers the adapted frequency signals to first antenna arrangement 6. The frequency divider receives the oscillating signal from an oscillator 40 of the second signal generator 4. On the basis of this oscillating signal, frequency divider 31 divides the oscillating signal frequency by factor 255, when a stable data modulation state is defined or when no data modulation is performed. However, during a modulation state transition phase for the change from a "1" state to a "0" state, or vice versa, the oscillating signal frequency is divided by factor 272. In this manner, drive circuit 32 delivers signals at a frequency temporarily equal to 120 kHz to first antenna arrangement 6. The first command signal $S_{Ti}$, delivered by synchronisation circuit 2, may be used to control the change in division factor of frequency divider 31.

The third signal generator 5 is formed of a programmable frequency divider 51 followed by a drive circuit 52, which delivers the adapted frequency signals to third antenna arrangement 8. The frequency divider receives the oscillating signal from oscillator 40 of the second signal generator 4. On the basis of this oscillating signal, frequency divider 51 divides the oscillating signal frequency by factor 255, when a stable data modulation state is defined or when no data modulation is performed. However, during a modulation state transition phase for the change from a "1" state to a "0" state, or vice versa, the oscillating signal frequency is divided by factor 240. In this manner, drive circuit 52 delivers signals at a frequency temporarily equal to 136 kHz to third antenna arrangement 8. The first command signal $S_{Ti}$, delivered by synchronisation circuit 2, may also be used to control the change in division factor of frequency divider 51.

It should be noted that the division factor of each frequency divider 31, 41, 51 may be determined according to the desired carrier frequency f0 and the frequency deviation Δf. For a division factor equal to N, which is an integer number, the divided signals at the frequency dividers' output are at a carrier frequency f0 determined according to the frequency of the oscillating signal from the oscillator. For the signals at frequency f0−Δf for the first antenna arrangement 6, the division factor of frequency divider 31 is equal to N·(1+Δf/f0). For the signals at frequency f0+Δf for the third antenna arrangement 6, the division factor of frequency divider 51 is equal to N·(1−Δf/f0).

Drive circuits 32 and 52 of the first and third signal generators 3 and 5, may also be controlled by the microprocessor processing unit to adapt the amplitude of the signals transmitted by the first and third antenna arrangements 6 and 8. The amplitude of the signals of the first and third antenna arrangements 6 and 8 may be adapted to be half the amplitude of the signals of the second antenna arrangement 7.

Synchronisation circuit 2 includes a first D-type flip-flop 21 for receiving at input the modulation signal $S_{mod}$, which may be formed of rectangular pulses representing the data or at least one command to be transmitted. The non-inverted output Q of the first flip-flop 21 is connected to a first input of an Exclusive-OR gate 23, while the inverted output Qb of the first flip-flop is connected to the input of a counter-by-n 22, where n is an integer number greater than 1. The output of counter 22 is connected to a second input of the Exclusive-OR gate 23. The output of this Exclusive-OR gate 23 is connected to the input of a second D-type flip-flop 24, which is capable of delivering, in particular, the first command signal $S_{Ti}$ at an inverted output Qb and the second command signal $S_T$ at a non-inverted output Q. These command signals $S_T$ and $S_{Ti}$ are thus partly used to control the opening or closing of switches 9 and 10 of antenna arrangements 6 and 8.

The first and second D-type flip-flops 21 and 24 are clocked by a clocking signal from a zero crossing detector 25. Zero crossing detector 25 detects the zero crossings of the sinusoidal voltage at the connection node between inductance A2 and capacitor $C_{21}$ of the second antenna arrangement 7. This sinusoidal voltage represents the shape of the signals transmitted from second antenna arrangement 7. The sinusoidal voltage is thus converted via zero crossing detector 25 into a clocking signal formed of successive rectangular pulses at the same frequency f0 as the sinusoidal voltage.

Counter-by-n 22 is normally also clocked on the basis of the rising edges of the clock pulses delivered by zero crossing detector 25. When there is a change of state at inverted output Qb of first flip-flop 21, the new state of output Qb is only transmitted at the output of counter 22 after n clocking pulses have been delivered by zero crossing detector 25. These n pulses match the number n of cycles of the sinusoidal voltage across capacitor $C_{21}$ or of the signals transmitted by antenna A2 of second antenna arrangement 7. During a period matching n clocking pulses, the Exclusive-OR gate only delivers a "0" state to the input of the second flip-flop 24. The first command signal $S_{Ti}$ at the inverted output Qb of second flip-flop 24 is thus at a high "1" level for the duration of n clocking pulses, which correspond to the modulation state transition phase. During this modulation state transition phase, the resonance frequencies of first antenna arrangement 6 and of third antenna arrangement 8 are adapted as a function of the modified frequencies of the signals delivered by the first and third signal generators 3 and 5.

FIG. 4 shows a second, more detailed embodiment of transmission device 1. It should be noted that any elements in FIG. 4 which are the same as those in FIGS. 1 and 3 bear identical reference signs. Consequently, for the sake of simplification, the description of all these elements will not be repeated. The resonance frequency of the first and third antenna arrangements 6 and 8 is adapted in a capacitive manner as for the general embodiment shown in FIG. 1 and the first embodiment shown in FIG. 3.

The second signal generator 4 preferably includes an oscillator 40 capable of generating an oscillating signal at a frequency which matches the carrier frequency of the signals to be transmitted by second antenna arrangement 7. The oscillating signal frequency may thus be selected for example to be at 128 kHz, like the carrier frequency f0 of the signals to be transmitted by second antenna arrangement 7. The oscillating signal may be of sinusoidal shape, but preferably formed of rectangular pulses delivered straight to drive circuit 42. Drive circuit 42 thus delivers the signals at carrier frequency f0 to second antenna arrangement 7.

The second signal generator 4 also includes a frequency multiplier 43 directly connected to oscillator 40. This frequency multiplier is used to multiply the oscillating signal frequency by a factor n1, which is an integer number greater than 1. The multiplied frequency signal in frequency multiplier 43 is delivered to the first and third signal generators 3 and 5. Where the carrier frequency f0 of the signals to be transmitted by antenna A2 is selected to be 128 kHz, the multiplication factor n1 may be selected to be equal to 255.

The first signal generator 3 includes first and second frequency division branches for the multiplied frequency signal received from frequency multiplier 43. In the first division branch, the frequency is divided by factor n1 so as to deliver signals at carrier frequency f0 at the output of the first signal generator 3. In the second division branch, the frequency is divided by a factor n2, which is an integer number greater than 1. This factor n2 is selected so that the first signal generator temporarily delivers signals to first antenna arrangement 6 at frequency f1=f0−Δf, during the modulation state transition phase. Frequency f1 is therefore determined by f0·n1/n2. To obtain frequency f1 equal to 120 kHz for example, factor n2 must be equal to 272.

The first signal generator 3 thus includes for the first division branch, a first inverter 30, which receives the first command signal $S_{Ti}$ from synchronisation circuit 2. This first command signal $S_{Ti}$ is at the "1" state during the modulation state transition phase and at the "0" state for each stable modulation state before and after the transition phase. The first branch is therefore used when the first command signal $S_{Ti}$ is at the "0" state, while the second branch is used when the first command signal $S_{Ti}$ is at the "1" state.

The output of first inverter 30 of the first branch is connected to a first input of a first AND gate 33, which receives at a second input the multiplied frequency signal from frequency multiplier 43. The multiplied frequency signal is transmitted to a first counter-by-n1 35, if the output of first inverter 30 is at the "1" state. This enables the frequency of the multiplied frequency signal to be divided by factor n1. The output of first counter 35 is connected to a second AND gate 37 which receives, at a second input, the output signal from first inverter 30. The output of the second AND gate 37 is connected to a first input of an OR gate 39 to deliver the carrier frequency signal f0 to drive circuit 32. The configuration of drive circuit 32 is similar to that of FIG. 3 so as to deliver signals at carrier frequency f0 to first antenna arrangement 6 other than during the modulation state transition phase.

For the second division branch, the first command signal $S_{Ti}$ is delivered directly to a first input of a third AND gate 34, while the second input of AND gate 34 receives the multiplied frequency signal from frequency multiplier 43. The multiplied frequency signal is transmitted to a second counter-by-n2 36, if the first command signal $S_{Ti}$ is at the "1" state. This divides the frequency of the multiplied frequency signal by factor n2. The output of second counter 36 is connected to a fourth AND gate 38, which receives the first command signal $S_{Ti}$ at a second input. The output of the fourth AND gate 38 is connected to a second input of OR gate 39 to deliver the adapted frequency signal f1=f0−Δf to drive circuit 32. This adapted frequency f1 may thus be equal to 120 kHz in this embodiment of transmission device 1.

The third signal generator 5 also includes first and second frequency division branches for the multiplied frequency signal received from frequency multiplier 43. In the first division branch, the frequency is divided by factor n1 to output signals at carrier frequency f0 from the third signal generator 5 to the third antenna arrangement 8. In the second division branch the frequency is divided by a factor n3, which is an integer number greater than 1. This factor n3 is selected so that the third signal generator temporarily delivers signals to third antenna arrangement 8, at frequency f3=f0+Δf, during the modulation state transition phase. Frequency f3 is thus determined by f0·n1/n3. To obtain frequency f3 equal to 136 kHz, for example, factor n3 must be equal to 240.

The third signal generator 5 thus includes for the first division branch, a second inverter 50, which receives the first command signal $S_{Ti}$ from synchronisation circuit 2. This first command signal $S_{Ti}$ is at the "1" state during the modulation state transition phase and at the "0" state for each stable modulation state before and after the transition phase. The first branch is used when the first command signal $S_{Ti}$ is at the "0" state, while the second branch is used when the first command signal $S_{Ti}$ is at the "1" state.

The output of second inverter 50 of the first branch is connected to a first input of a first AND gate 53, which receives at a second input the multiplied frequency signal from frequency multiplier 43. The multiplied frequency signal is transmitted to a first counter-by-n1 55, if the output of second inverter 50 is at the "1" state. This enables the frequency of the multiplied frequency signal to be divided by factor n1. The output of first counter 55 is connected to a second AND gate 57 which receives, at a second input, the output signal from second inverter 50. The output of the second AND gate 57 is connected to a first input of an OR gate 59 to deliver the carrier frequency signal f0 to drive circuit 52. The configuration of drive circuit 52 is similar to that of FIG. 3 so as to deliver signals at carrier frequency f0 to third antenna arrangement 8 other than during the modulation state transition phase.

For the second division branch, the first command signal $S_{Ti}$ is delivered directly to a first input of a third AND gate 54, while the second input of AND gate 54 receives the multiplied frequency signal from frequency multiplier 43. The multiplied frequency signal is transmitted to a second counter-by-n3 56, if the first command signal $S_{Ti}$ is at the "1" state. This enables the frequency of the multiplied frequency signal to be divided by factor n3. The output of second counter 56 is connected to a fourth AND gate 58, which receives the first command signal $S_{Ti}$ at a second input. The output of the fourth AND gate 58 is connected to a second input of OR gate 59 to deliver the adapted frequency signal f3=f0+Δf to drive circuit 52. This adapted frequency f3 may thus be equal to 136 kHz in this embodiment of transmission device 1.

It should be noted that synchronisation circuit 2 includes the same elements as those described above with reference to FIG. 3. However, first flip-flop 21 may be clocked directly by the oscillating signal from oscillator 40, while the second flip-flop 24 remains clocked by the rectangular pulsed signal delivered by zero crossing detector 25.

Figure 5A:
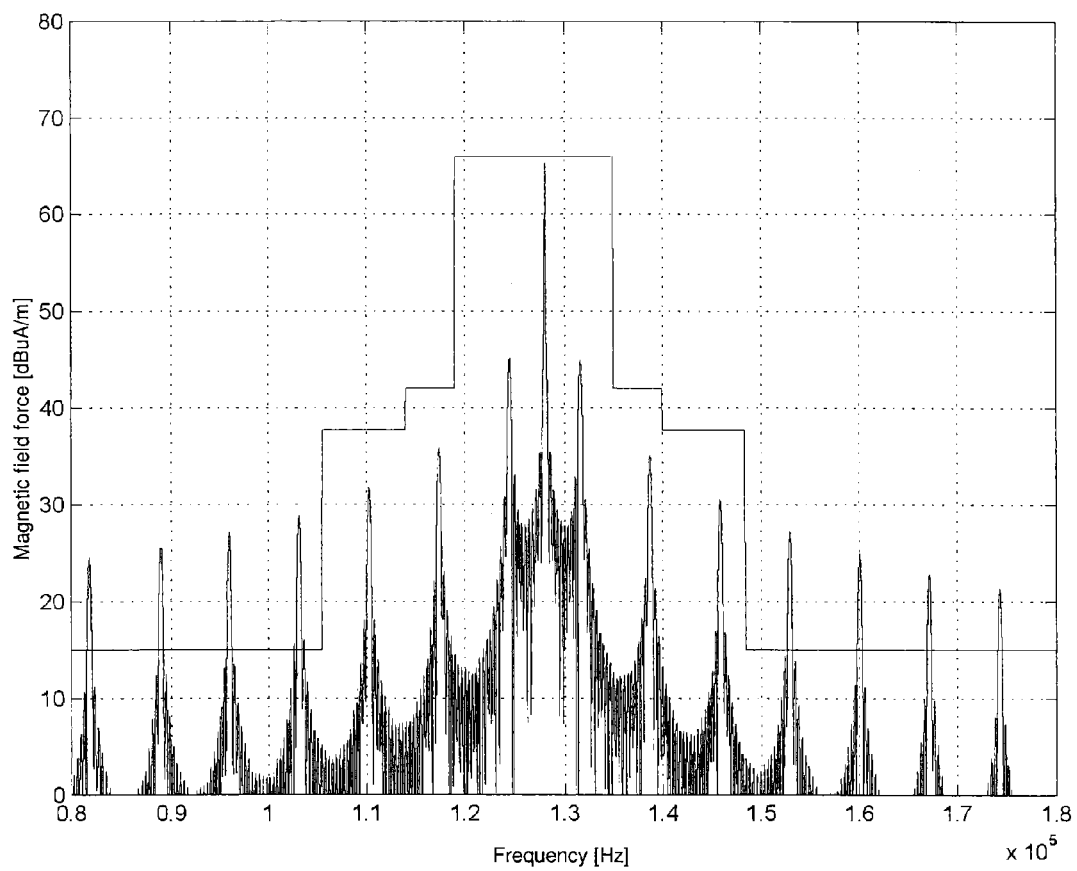
FIGS. 5a and 5b show two comparative graphs of the data amplitude modulation spectrum in signals transmitted by an antenna with synchronous switching at the current crossing through 0 A and by antenna arrangements according to the present invention.
Figure 5B:
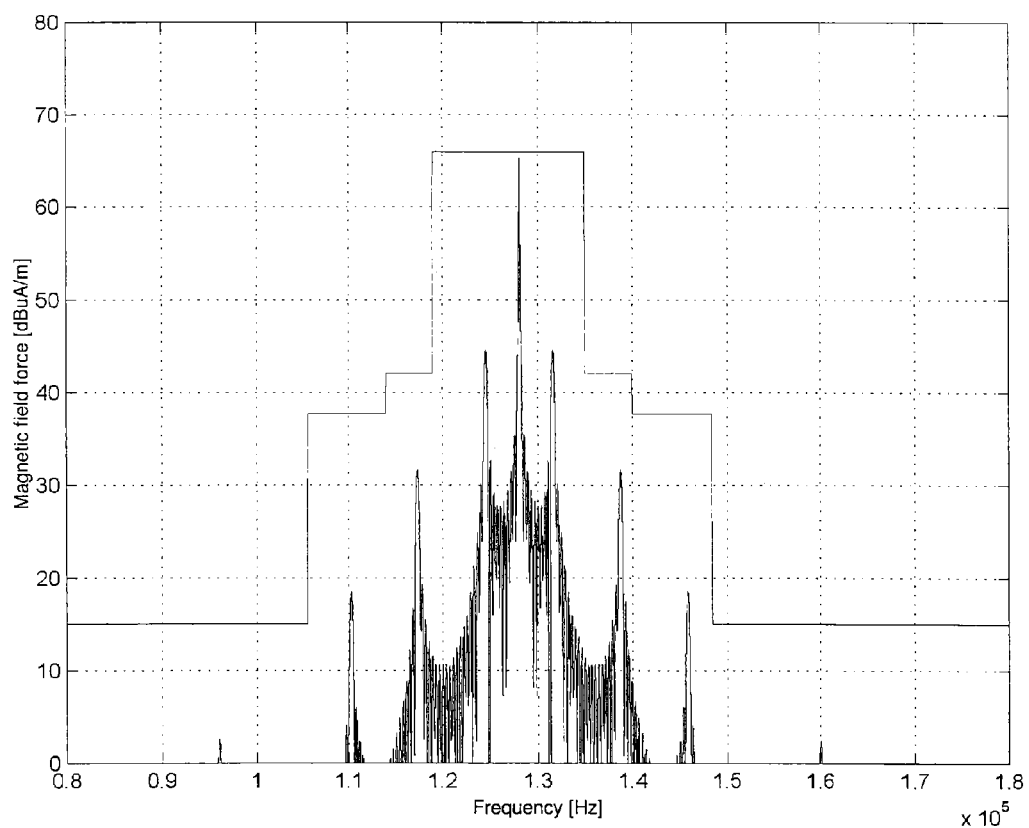

FIGS. 5a and 5b show two comparative graphs of the data amplitude modulation spectrum in the signals transmitted by a single antenna and by antenna arrangements according to the present invention. It is to be noted that with the transmission device of the present invention and the alternative principle using a set of antennas, harmonic frequencies are greatly reduced relative to the central frequency, which in this case is at 128 kHz. The magnetic field force of the transmission principle using three antenna arrangements of the invention is thus within the spectral mask of regulatory requirements according to the field of application, such as the field of sport. With amplitude modulation signal transmission using a single antenna, numerous harmonics occur which fall outside the required spectral mask.

From the description that has just been given, several variants of the data and/or command signal transmission device, and the method of activating the transmission device, can be devised by those skilled in the art without departing from the scope of the invention defined by the claims. Six antenna arrangements respectively controlled by six signal generators could be used. Three first antenna arrangements may transmit data and/or command signals as described above, and three second antenna arrangements, with the same configuration as the three first antenna arrangements, transmit signals with a 90° phase difference. Where the resonance frequency is adapted using a complementary inductance, a peak detector or minima/maxima crossing detector may be used to control the synchronisation circuit. Each frequency switch must occur in each modulation state transition phase when the current in the inductance of the second antenna arrangement and in the adapted inductances of the other antenna arrangements is equal to 0 A.

What is claimed is:

1. A data and/or command signal transmission device, comprising:
    a first signal generator connected to a first antenna arrangement,
    a second signal generator connected to a second antenna arrangement,
    an oscillator for delivering an oscillating signal, in order to clock the signal generators to control each antenna arrangement, and
    a synchronisation circuit connected at least to the first signal generator and to the first and second antenna arrangements, the synchronisation circuit being arranged to receive as an input a modulation signal of data and/or command and to control, in a synchronous manner, the first signal generator and the first and second antenna arrangements to perform amplitude modulation on the data and/or command to be transmitted on at least two amplitude levels by a combination of signals transmitted by the antenna arrangements, a first stable modulation state on a first amplitude level being defined when the signals transmitted at a defined carrier frequency f0 by the first and second antenna arrangements are in-phase, and a second stable modulation state on a second amplitude level being defined when the signals transmitted at the defined carrier frequency f0 by the first antenna arrangement are 180° out of phase from the signals transmitted at the defined carrier frequency f0 by the second antenna arrangement,
    wherein the synchronisation circuit is arranged to temporarily and dynamically switch the first signal generator for delivery of signals to the first antenna arrangement at a frequency f1 higher or lower than the carrier frequency f0 in a transition phase from a first modulation state to a second modulation state or vice versa in a synchronous manner on the basis of n signal cycles at the carrier frequency f0 transmitted by the second antenna arrangement and counted in the synchronisation circuit, where n is an integer number defining a number of cycles at frequency f0, and
    wherein the synchronisation circuit is arranged to adapt, in an inductive or capacitive manner, a resonance frequency of the first antenna arrangement to frequency f1 of the signals delivered by the first signal generator during the modulation state transition phase relative to a resonance frequency determined at the carrier frequency f0 of the first and second antenna arrangements in the first or second stable modulation state.

2. The data and/or command signal transmission device according to claim 1, further comprising:
    a third signal generator connected to a third antenna arrangement, which are controlled in a synchronous manner by the synchronisation circuit, to perform amplitude modulation on the data and/or command to be transmitted by a combination of the signals transmitted by the first, second and third antenna arrangements, the first stable modulation state being defined when the signals transmitted at the defined carrier frequency f0 by the first, second and third antenna arrangements are in-phase, while the second stable modulation state is defined when the signals transmitted by the first and third antenna arrangements are 180° out of phase from the signals transmitted by the second antenna arrangement,
    wherein the synchronisation circuit is arranged to temporarily and dynamically switch, during each modulation state transition phase, the third signal generator for delivery of signals to the third antenna arrangement at frequency f3=f0+Δf, whereas the signals temporarily delivered by the first signal generator to the first antenna arrangement are at frequency f1=f0−Δf, where Δf defines a frequency deviation determined such that (f0/Δf)/2 defines the number n of signal cycles at the carrier frequency f0 transmitted by the second antenna arrangement, and
    wherein the synchronisation circuit is arranged to adapt, in an inductive or capacitive manner, a resonance frequency of the third antenna arrangement to frequency f3 of the signals delivered by the third signal generator during the modulation state transition phase.

3. The data and/or command signal transmission device according to claim 2, wherein the synchronisation circuit is arranged to adapt, in an inductive or capacitive manner, the resonance frequency of the first and third antenna arrangements to frequency f1 and to frequency f3, respectively, at a moment when a current is at 0 A for an inductive element or a voltage is at 0 V for a capacitive element.

4. The data and/or command signal transmission device according to claim 2, wherein the signals transmitted by the first antenna arrangement are at frequency f1=f0·(n−0.5)/n during the modulation state transition phase, while the signals transmitted by the third antenna arrangement are at frequency f3=f0·(n+0.5)/n.

5. The data and/or command signal transmission device according to claim 2, wherein the first, second and third antenna arrangements each include, in series between the output of the first, second and third signal generators and an earth terminal, a loss resistor, an inductance defining an antenna and at least a first capacitor, wherein the first antenna arrangement further includes a first parallel capacitor able to be placed in parallel to the first capacitor of the first antenna arrangement via a first switch controlled by a first command signal of the synchronisation circuit to adapt the resonance frequency, and wherein the third antenna arrangement further includes a second parallel capacitor able to be placed in parallel to the first capacitor of the third antenna arrangement via a second switch controlled by a second command signal of the synchronisation circuit to adapt the resonance frequency.

6. The data and/or command signal transmission device according to claim 5, wherein the first command signal is the inverse of the second command signal, and wherein the first command signal is arranged to close the first switch in the modulation state transition phase, while the second command signal is arranged to open the second switch in the modulation state transition phase.

7. The data and/or command signal transmission device according to claim 5, wherein antennas of the first, second and third antenna arrangements are disposed so as to be oriented in the same direction, with the axes thereof parallel to each other, the dimension of the area occupied by the antennas being smaller than the wavelength of the signals transmitted by the antennas.

8. The data and/or command signal transmission device according to claim 5, wherein the synchronisation circuit includes a zero crossing detector connected to a connection node between the antenna and the first capacitor of the second antenna arrangement, to detect the zero crossings of the sinusoidal voltage generated across the first capacitor, in order to synchronise the delivery of the first and second command signals to the first and third antenna arrangements to adapt the resonance frequency.

9. The data and/or command signal transmission device according to claim 8, wherein the synchronisation circuit includes a first D-type flip-flop for receiving at input a modulation signal dependent on the data and/or command to be transmitted, a non-inverted output of the first flip-flop being connected to a first input of an Exclusive-OR gate, while an inverted output of the first flip-flop is connected to an input of a counter-by-n, where n is an integer number greater than 1 defining the number of cycles to be counted of the signals at carrier frequency f0 transmitted by the second antenna arrangement, an output of said counter being connected to a second input of the Exclusive-OR gate, an output of the Exclusive-OR gate being connected to an input of a second D-type flip-flop, the second flip-flop delivering the first command signal at an inverted output, and the second command signal at a non-inverted output, said second flip-flop being clocked by a clocking signal delivered by the zero crossing detector, while the first flip-flop is clocked either by the oscillating signal of the oscillator, or by the clocking signal of the zero crossing detector.

10. The data and/or command signal transmission device according to claim 2, wherein the first, second and third signal generators each include a frequency divider for dividing, by a first factor, the frequency of the oscillating signal from the oscillator, so as to deliver a divided frequency signal to a drive circuit, which controls the delivery of signals at carrier frequency f0 to the first, second and third antenna arrangements in each stable modulation state, wherein the frequency divider of the first signal generator is programmed by a first command signal delivered by the synchronisation circuit, to divide the frequency of the oscillating signal by a second factor, different from the first factor, so that the drive circuit of the first signal generator controls the delivery of signals at frequency f1=f0−Δf to the first antenna arrangement in the modulation state transition phase, and wherein the frequency divider of the third signal generator is programmed by the first command signal delivered by the synchronisation circuit, to divide the frequency of the oscillating signal by a third factor, different from the first and second factors, so that the drive circuit of the third signal generator controls the delivery of signals at frequency f3=f0+Δf to the third antenna arrangement in the modulation state transition phase.

11. The data and/or command signal transmission device according to claim 10, wherein the drive circuits are each arranged to be controlled by a processing unit, so as to adapt the amplitude of the signals transmitted by at least one of the first, second and third antenna arrangements.

12. The data and/or command signal transmission device according to claim 11, wherein the drive circuit of the second signal generator is arranged to adapt the amplitude of the signals transmitted by the second antenna arrangement to a level two times higher than the amplitude of the signals transmitted by the first and third antenna arrangements and adapted by the drive circuits of the first and third signal generators.

13. The data and/or command signal transmission device according to claim 2, wherein the second signal generator includes the oscillator, a frequency multiplier for multiplying, by a factor n1, the frequency of the oscillating signal from the oscillator, so as to deliver a multiplied frequency signal to the first and third signal generators and a drive circuit receiving the oscillating signal to control the delivery of signals at carrier frequency f0 to the second antenna arrangement, wherein the first and third signal generators each include first and second frequency division branches for the multiplied frequency signal received from the frequency multiplier, the first branch or the second branch being selected by a first command signal delivered by the synchronisation circuit, in the first division branch, the frequency being able to be divided by factor n1 so that drive circuits of the first and third signal generators control the delivery of signals at carrier frequency f0 to the first and third antenna arrangements in a stable modulation state, while in the second division branch, the frequency is divided by a factor n2 different from factor n1 in the first signal generator and by a factor n3 different from factors n1 and n2 in the third signal generator, so that the drive circuit of the first signal generator controls the delivery of signals at frequency f1=f0−Δf=f0·n1/n2 to the first antenna arrangement in the modulation state transition phase, and so that the drive circuit of the third signal generator controls the delivery of signals at frequency f3=f0+Δf=f0·n1/n3 to the third antenna arrangement in the modulation state transition phase.

14. The data and/or command signal transmission device according to claim 13, wherein the first division branch of the first and third signal generators each has at input an inverter so as to select the first branch in a first state of the first command signal, and the second branch in a second state of the first command signal.

15. The data and/or command signal transmission device according to claim 14, wherein the first division branch of the first and third signal generators includes a first AND gate for receiving the inverter output signal and the multiplied frequency signal from the frequency multiplier, a first counter-by-n1 connected to the output of the first AND gate, a second AND gate receiving at a first input the output signal from the first counter and the output signal from the inverter, an output of the second AND gate being connected via an OR gate to the drive circuit for the delivery of signals at carrier frequency f0 to the first and third antenna arrangements, wherein the second division branch of the first and third signal generators includes a third AND gate for directly receiving the first command signal at a first input and the multiplied frequency signal at a second input, a second counter-by-n2 for the first signal generator or a second counter-by-n3 for the third signal generator each connected to the output of the third AND gate, a fourth AND gate receiving at a first input the output signal from the second counter-by-n2 of the first signal generator or from the second counter-by-n3 of the third signal generator, an output of the fourth AND gate being connected via the OR gate to the drive circuit for the delivery of signals at frequency f1 for the first antenna arrangement and the delivery of signals at frequency f3 for the third antenna arrangement in modulation state transition phase.

16. The data and/or command signal transmission device according to claim 13, wherein the drive circuits are each arranged to be controlled by a processing unit, so as to adapt the amplitude of the signals transmitted by at least one of the first, second and third antenna arrangements.

17. A method of actuating a data and/or command signal transmission device, which includes a first signal generator connected to a first antenna arrangement, a second signal generator connected to a second antenna arrangement, an oscillator for delivering an oscillating signal, in order to clock the signal generators to control each antenna arrangement, and a synchronisation circuit connected at least to the first signal generator and to the first and second antenna arrangements, said method comprising:

delivering a data and/or command modulation signal to the synchronisation circuit;

synchronously controlling via the synchronisation circuit at least the first signal generator, and the first and second antenna arrangements to perform amplitude modulation on the data and/or command to be transmitted on at least two amplitude levels by combining signals transmitted by the antenna arrangements, a first stable modulation state on a first amplitude level being defined when the signals transmitted at a defined carrier frequency f0 by the first and second antenna arrangements are in-phase, and a second stable modulation state on a second amplitude level being defined when the signals transmitted at the defined carrier frequency f0 by the first antenna arrangement are 180° out of phase from the signals transmitted at the defined carrier frequency f0 by the second antenna arrangement;

temporarily and dynamically switching the first signal generator via the synchronisation circuit for delivery to the first antenna arrangement of signals at a frequency f1 lower or higher than the carrier frequency f0 in a modulation state transition phase and synchronously on the basis of n cycles of signals at carrier frequency f0 transmitted by the second antenna arrangement and counted in the synchronisation circuit, where n is an integer number defining a number of cycles at frequency f0; and adapting, in an inductive or capacitive manner, a resonance frequency of the first antenna arrangement to frequency f1 during the modulation state transition phase.

18. A method of actuating a data and/or command signal transmission device, which includes a first signal generator connected to a first antenna arrangement, a second signal generator connected to a second antenna arrangement, a third signal generator connected to a third antenna arrangement, an oscillator for delivering an oscillating signal, in order to clock the signal generators to control each antenna arrangement, and a synchronisation circuit connected at least to the first signal generator and to the first and second antenna arrangements, said method comprising:

delivering a data and/or command modulation signal to the synchronisation circuit;

synchronously controlling via the synchronisation circuit at least the first signal generator and the third signal generator, and the first, second and third antenna arrangements to perform amplitude modulation on the data and/or command to be transmitted on at least two amplitude levels by combining signals transmitted by the antenna arrangements, a first stable modulation state on a first amplitude level being defined when the signals transmitted at a defined carrier frequency f0 by at least one of the first, second and third antenna arrangements are in-phase, and a second stable modulation state on a second amplitude level being defined when the signals transmitted at the defined carrier frequency f0 by the first and third antenna arrangements are 180° out of phase from the signals transmitted at the defined carrier frequency f0 by the second antenna arrangement;

temporarily and dynamically switching the first and third signal generators via the synchronisation circuit for delivery to the first antenna arrangement of signals at a frequency f1 lower or higher than the carrier frequency f0, and for delivery to the third antenna arrangement of signals at a frequency f3 higher or lower than carrier frequency f0 and inversely to frequency f1 in a modulation state transition phase and synchronously on the basis of n cycles of signals at carrier frequency f0 transmitted by the second antenna arrangement and counted in the synchronisation circuit, where n is an integer number defining a number of cycles at frequency f0; and adapting, in an inductive or capacitive manner, a resonance frequency of the first antenna arrangement to frequency f1 and a resonance frequency of the third antenna arrangement to frequency f3 during the modulation state transition phase.

* * * * *